United States Patent [19]

Kumar

[11] Patent Number: 5,528,242
[45] Date of Patent: Jun. 18, 1996

[54] FLASH ANALOG-TO-DIGITAL CONVERTER

[75] Inventor: Niraj Kumar, Fremont, Calif.

[73] Assignee: Zilog, Inc., Campbell, Calif.

[21] Appl. No.: 287,868

[22] Filed: Aug. 9, 1994

[51] Int. Cl.[6] .................................................. H03M 1/36
[52] U.S. Cl. .............................................................. 341/159
[58] Field of Search ...................................... 341/159, 156, 341/136, 122, 158, 155

[56] References Cited

U.S. PATENT DOCUMENTS

| | | |
|---|---|---|
| 4,571,574 | 2/1986 | Krynicki . |
| 4,918,449 | 4/1990 | Chin .......................................... 341/156 |
| 5,070,332 | 12/1991 | Kaller et al. . |
| 5,296,858 | 3/1994 | Moyal ....................................... 341/156 |

*Primary Examiner*—Brian K. Young
*Attorney, Agent, or Firm*—Majestic, Parsons, Siebert & Hsue

[57] ABSTRACT

A two-step flash ADC includes a MSB reference ladder having a first plurality resistors of resistance r and a second plurality of resistors of resistance R, serially connected together on an alternating basis starting and ending with one of the first plurality of resistors. A LSB reference ladder having a total resistance $R_L$ is initially connected across a predetermined (2r+R) leg of the MSB reference ladder. The resistances r, R, and $R_L$ are selected such that the effective resistance resulting from connecting the LSB reference ladder in parallel with a (2r+R) leg of the MSB reference ladder is equal to a (r+R) leg of the MSB reference ladder. In a first step of the two-step flash ADC, MSB reference voltages are picked-off the MSB reference ladder from actual or effective (r+R) legs of the MSB reference ladder, compared against an analog input voltage, and used to generate the most-significant-bits of a digital number corresponding to the analog input voltage. In a second step of the two-step flash ADC, the LSB reference ladder is connected to a portion of the MSB reference ladder determined by the analog input voltage, LSB reference voltages are picked-off the LSB reference ladder from which the least-significant-bits of the digital number corresponding to the analog input voltage is generated. Carryover logic generates the digital number corresponding to the analog input voltage from the most-significant-bits and least-significant-bits thus generated.

10 Claims, 9 Drawing Sheets

| TM15'-TM01' | MSB4-MSB1 | K01/K01'-K16/K16' (turned ON pair) | MS15-MS01 |
|---|---|---|---|
| 000000000000000 | 0000 | K01/K01' | 111111111111111 |
| 000000000000001 | 0001 | K02/K02' | 011111111111111 |
| 000000000000011 | 0010 | K03/K03' | 001111111111111 |
| 000000000000111 | 0011 | K04/K04' | 000111111111111 |
| 000000000001111 | 0100 | K05/K05' | 000011111111111 |
| 000000000011111 | 0101 | K06/K06' | 000001111111111 |
| 000000000111111 | 0110 | K07/K07' | 000000111111111 |
| 000000001111111 | 0111 | K08/K08' | 000000011111111 |
| 000000011111111 | 1000 | K09/K09' | 000000001111111 |
| 000000111111111 | 1001 | K10/K10' | 000000000111111 |
| 000001111111111 | 1010 | K11/K11' | 000000000011111 |
| 000011111111111 | 1011 | K12/K12' | 000000000001111 |
| 000111111111111 | 1100 | K13/K13' | 000000000000111 |
| 001111111111111 | 1101 | K14/K14' | 000000000000011 |
| 011111111111111 | 1110 | K15/K15' | 000000000000001 |
| 111111111111111 | 1111 | K16/K16' | 000000000000000 |

FLASH ANALOG-TO-DIGITAL CONVERTER

BACKGROUND OF THE INVENTION

This invention relates in general to flash analog-to-digital converters ("ADCs") and in particular, to a technique and circuit for connecting a least-significant-bits ("LSB") reference ladder to a most-significant-bits ("MSB") reference ladder in a two-step flash ADC (also referred to as a "half-flash ADC").

The two-step flash ADC provides much of the same speed advantages as a one-step flash ADC (also referred to as a "full flash ADC") as compared to, for examples, dual-slope and successive approximation ADCs, while its design is considerably less complex than that of the one-step flash ADC. In particular, whereas a one-step flash ADC requires $2^n-1$ comparators for n-bit resolution, a two-step flash ADC only requires $2^{n/2+1}-1$ comparators. Since fewer comparators are required, the die size of an integrated circuit implementing a two-step flash ADC can be considerably smaller than that of an integrated circuit implementing a one-step flash ADC of comparable bit resolution and as a result, its manufacturing cost may be considerably less. Also, since fewer comparators are required, the power consumption of an integrated circuit implementing a two-step flash ADC may be considerably less than that for an integrated circuit implementing a one-step flash ADC of comparable resolution.

Figure 1:
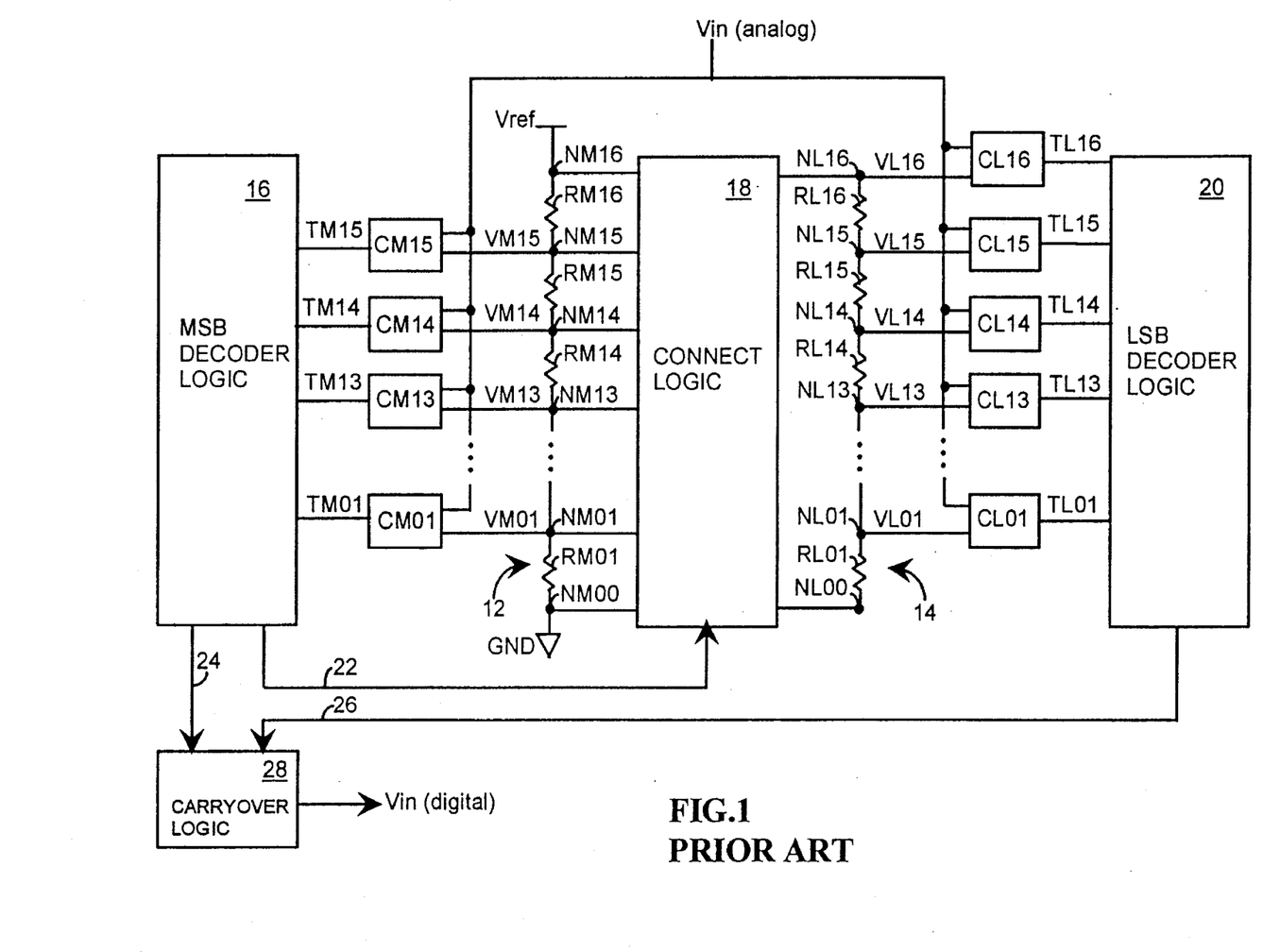
FIG. 1 illustrates, as an example, a block diagram of a prior art two-step flash ADC.

FIG. 1 is useful for illustrating the basic operation of a two-step flash ADC. In particular, a MSB reference ladder 12 and its corresponding MSB comparators CM01–CM15, a LSB reference ladder 14 and its corresponding LSB comparators CL01–CL16, a MSB decoder logic circuit 16 for processing the outputs of the MSB comparators CM01–CM15, a connection logic circuit 18 for connecting the LSB reference ladder 14 across a selected portion of the MSB reference ladder 12, a LSB decoder logic circuit 20 for processing the outputs of the LSB comparators CL01–CL16, and a carryover logic circuit 28 for generating the digital output of the two-step flash ADC are shown. The MSB reference ladder 12 includes a plurality of equal-valued resistors RM01–RM16 (each having a resistance value of RM) serially connected together between a reference voltage Vref and ground GND to form a voltage divider circuit providing MSB reference voltages VM01–VM15 at respective nodes NM01–NM15 of the MSB reference ladder 12. The LSB reference ladder 14 also includes a plurality of equal-valued resistors RL01–RL16 serially connected together between selected adjacent nodes of the MSB reference ladder 12 to form a second voltage divider circuit having a total resistance of $R_L$ and providing LSB reference voltages VL01–VL16 at respective nodes NL01–NL16 of the LSB reference ladder 14.

In a first step of the two-step flash ADC, a gross resolution of the analog input voltage Vin is conducted by simultaneously comparing the input voltage Vin against each of the MSB reference voltages VM01–VM15. In particular, each of the MSB comparators CM01–CM15 receives and compares the input voltage Vin against a corresponding one of the MSB reference voltages VM01–VM15, and generates an output as a result of that comparison. The respective outputs TM01–TM15 of the MSB comparators CM01–CM15 resemble a so-called "thermometer" output in that each output corresponding to a MSB reference voltage less than the input voltage Vin is HIGH, and each output corresponding to a MSB reference voltage greater than or equal to the input voltage Vin is LOW. Where the thermometer outputs TM01–TM15 of the MSB comparators CM01–CM15 transition from a HIGH to a LOW output, the input voltage Vin is determined to be either somewhere in between the two MSB reference voltages corresponding to the HIGH to LOW transition outputs, or equal to the higher of the two MSB reference voltages corresponding to the HIGH to LOW transition outputs. The MSB decoder logic circuit 16 receives the thermometer outputs TM01–TM15, and decodes them to generate the four most-significant-bits 24 of an 8-bit binary number representing the analog input voltage Vin and to generate control signals 22 provided to the connect logic circuit 18.

In a second step of the two-step flash ADC, a finer resolution of the analog input voltage Vin is conducted by connecting the LSB reference ladder 14 across the two MSB reference voltages corresponding to the previously determined HIGH to LOW transition outputs of the MSB comparators CM01–CM15, and comparing the input voltage Vin against each of the LSB reference voltages VL01–VL16. The respective outputs TL01–TL16 of the LSB comparators CL01–CL16 also resemble a so-called "thermometer" output in that each of the outputs corresponding to a LSB reference voltage less than the input voltage Vin is HIGH, and each of the outputs corresponding to a LSB reference voltage greater than the input voltage Vin is LOW. Where the thermometer outputs TL01–TL16 of the LSB comparators CL01–CL16 transition from a HIGH to a LOW output, the input voltage Vin is determined to be either somewhere in between the two LSB reference voltages corresponding to the HIGH to LOW transition outputs, or equal to the higher of the two LSB reference voltages corresponding to the HIGH to LOW transition outputs. The LSB decoder logic circuit 20 receives the thermometer outputs TL01–TL16, and decodes them to generate the four least-significant-bits 26 of the 8-bit binary number representing the analog input voltage Vin. The 8-bit binary number representing the analog input voltage Vin is then generated by the carryover logic circuit 28 from the four most-significant-bits 24 from the MSB decoder logic circuit 16 and the four least-significant-bits 26 from the LSB decoder logic circuit 20. Except for the case where all sixteen outputs TL01–TL16 of the LSB comparators CL01–CL16 are HIGH, the carryover logic circuit 28 generates the 8-bit binary number representing the analog input voltage Vin by merely combining the four most-significant-bits 24 from the MSB decoder logic circuit 16 with the four least-significant-bits 26 from the LSB decoder logic circuit 20. For example, if the four most-significant-bits 24 from the MSB decoder logic circuit 16 are respectively HIGH, HIGH, LOW, and LOW (i.e., 1100), and the four least-significant-bits 26 from the LSB decoder logic circuit 20 are respectively LOW, HIGH, LOW, and LOW (i.e., 0100), then the 8-bit binary number generated by the carryover logic circuit 28 would be 11000100. In the case where all sixteen outputs TL01–TL16 of the LSB comparators CL01–CL16 are HIGH, however, the carryover logic circuit 28 generates the 8-bit binary number representing the analog input voltage Vin by incrementing the four most-significant-bits 24 from the MSB decoder logic circuit 16 by one and setting each of the four least-significant-bits 26 from the LSB decoder logic circuit 20 to LOW. For example, if the four most-significant-bits 24 from the MSB decoder logic circuit 16 are 1100, and all sixteen outputs TL01–TL16 of the LSB comparators CL01–CL16 are HIGH, then the 8-bit binary number generated by the carryover logic circuit 28 would be 11010000.

Figure 2:
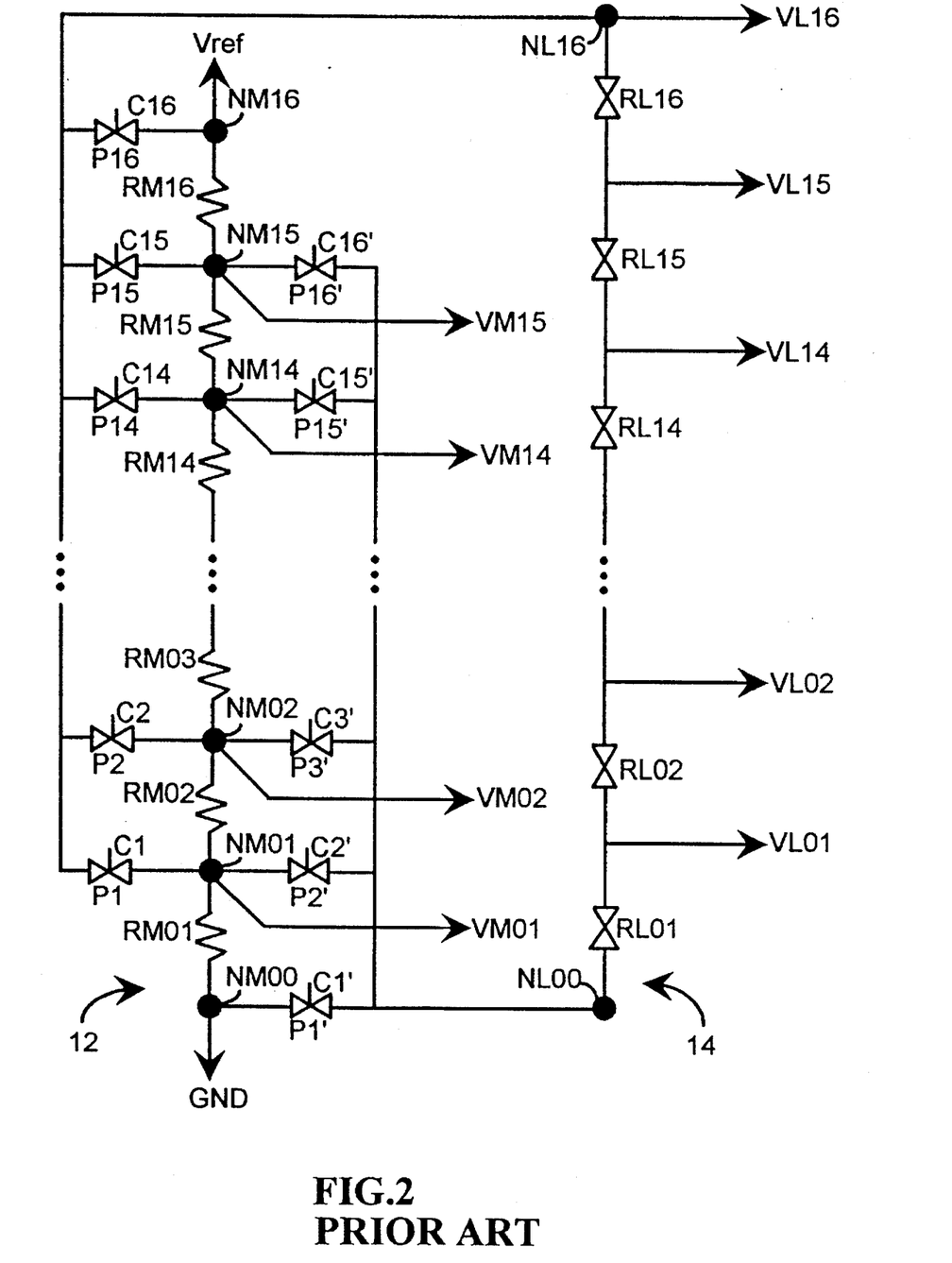
FIG. 2 illustrates, as an example, a circuit diagram of a prior art MSB reference ladder, LSB reference ladder, and connection logic circuit for connecting the LSB reference ladder to the MSB reference ladder.

FIG. 2 illustrates an example of the MSB reference ladder 12, the LSB reference ladder 14, and the connection logic circuit 18. The MSB reference ladder 12 comprises sixteen equal-valued resistors RM01–RM16 connected in series between Vref and ground GND to form a voltage divider circuit. The LSB reference ladder 14 comprises sixteen passgates RL01–RL16 also connected in series to form a voltage divider circuit, wherein each of the passgates RL01–RL16 acts as a high valued resistor by always being turned ON. The connection logic circuit 18 comprises passgates P1–P16 and P1'–P16', wherein passgate pairs are formed by pairing unprimed and primed passgates having the same numbers (e.g., P1 and P1'). The LSB reference ladder 14 is connected across adjacent nodes of the MSB reference ladder 12 by selectively turning ON one of the passgate pairs P1/P1'–P16/P16', while turning OFF all other passgate pairs. For example, to connect the LSB reference ladder 14 across nodes NM14 and NM15 of the MSB reference ladder 12, control signals C15' and C15 from the MSB decoder logic circuit 16 would turn ON their respective passgates P15' and P15, while control signals C1'–C14', C16', C1–C14, and C16 from the MSB decoder logic circuit 16 would turn OFF their respective passgates P1'–P14', P16', P1–P14, and P16.

Figure 3A:
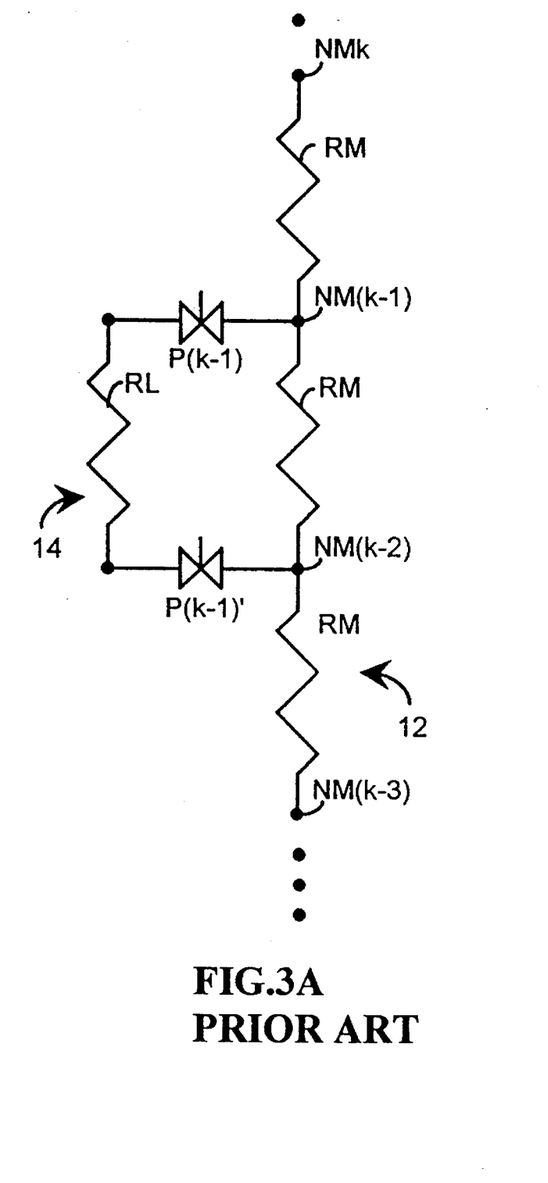
FIGS. 3A and 3B respectively illustrate a LSB reference ladder connected across two adjacent nodes of a prior art MSB reference ladder, and an effective MSB reference ladder with the LSB reference ladder so connected.
Figure 3B:
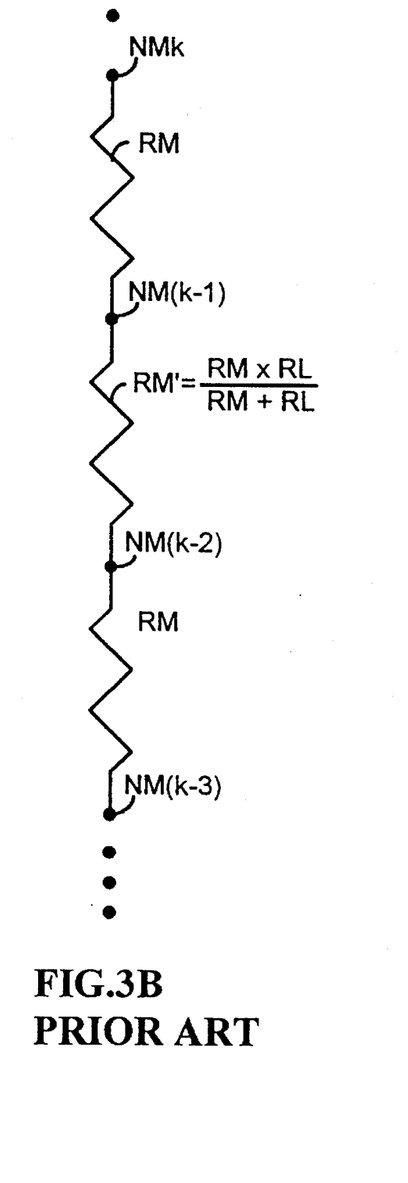

FIGS. 3A and 3B are useful for illustrating one problem with the two-step flash ADC as described in reference to FIG. 1. When the LSB reference ladder 14 is connected across two adjacent nodes NM(k–2) and NM(k–1) of the MSB reference ladder 12, the LSB reference ladder 14 tends to disturb the MSB reference ladder 12. In particular, the effective resistance RM' across the two adjacent nodes NM(k–2) and NM(k–1) of the MSB reference ladder 12 changes from a value of RM to another value equal to RM in parallel with $R_L$, where $R_L$ is the total resistance of the LSB reference ladder 14. As a consequence, the differential voltage between the MSB reference voltages VM(k–2) and VM(k–1), respectively corresponding to nodes NM(k–2) and NM(k–1), is different than that between all other MSB reference voltages on the MSB reference ladder 12, causing a slight measurement error in the two-step flash ADC described. For example, the differential voltage between the MSB reference voltages VM(k–2) and VM(k–1) is:

$$\Delta V = I * \left( \frac{R_L * RM}{R_L + RM} \right) \quad (1)$$

whereas the differential voltage between all other MSB reference voltages is:

$$\Delta V = I * RM \quad (2)$$

where I is equal to the current flowing through the MSB reference ladder 12, and RM is the resistance value of each of the equal-valued resistors RM01–RM16. Consequently, if RM is equal to 200Ω and $R_L$ is equal to 3,200Ω, then the differential voltage between the MSB reference voltages VM(k–2) and VM(k–1) would be approximately equal to I*188Ω, whereas the differential voltage between all other MSB reference voltages would be equal to I*200Ω.

U.S. Pat. No. 4,571,574, incorporated herein by this reference, describes one technique of avoiding the above described LSB reference ladder connection problem by employing a LSB reference ladder having the same resistance value as each MSB resistor of a MSB reference ladder, and switchably replacing one of the MSB resistors connected across two adjacent nodes of the MSB reference ladder with the LSB reference ladder when connecting the LSB reference ladder across the two adjacent nodes. The switching means required for such switchable replacement, however, significantly adds to the complexity of such integrated circuits.

OBJECT AND SUMMARY OF THE INVENTION

Accordingly, one object of the present invention is a two-step flash ADC whose accuracy is unaffected by the connection of a LSB reference ladder to selected portions of a MSB reference ladder.

This and additional objects are accomplished by the various aspects of the present invention, wherein one aspect is a circuit for generating a plurality of MSB reference voltages and a plurality of LSB reference voltages in a two-step flash ADC having a plurality of MSB comparators for comparing an analog input voltage against the plurality of MSB reference voltages and a plurality of LSB comparators for comparing the analog input voltage against the plurality of LSB reference voltages for generating a binary number indicative of the input voltage. The circuit includes a LSB resistor network having a total resistance $R_L$; a MSB resistor network connected between high and low reference voltages, wherein the MSB resistor network includes a first plurality of resistors each having a resistance r and a second plurality of resistors each having a resistance R, the number of the first plurality of resistors is one greater than the number of the second plurality of resistors, and the resistances r, R and $R_L$ are such that an effective resistance formed by the LSB resistor network in parallel with a first series connection consisting of two of the first plurality of resistors and one of the second plurality of resistors is substantially equal to a second series connection consisting of one of the first plurality of resistors and one of the second plurality of resistors; and means for connecting the LSB resistor network in parallel with a selected portion of the MSB resistor network, wherein the selected portion of the MSB resistor network has a resistance substantially equal to the first series connection consisting of two of the first plurality of resistors and one of the second plurality of resistors, and generating the plurality of MSB reference voltages from selected nodes of the MSB resistor network, and generating the plurality of LSB reference voltages from selected nodes of the LSB resistor network.

Additional objects, features and advantages of the various aspects of the present invention will become apparent from the following description of its preferred embodiment, which description should be taken in conjunction with the accompanying drawings.

DESCRIPTION OF THE PREFERRED EMBODIMENT

Figure 6:
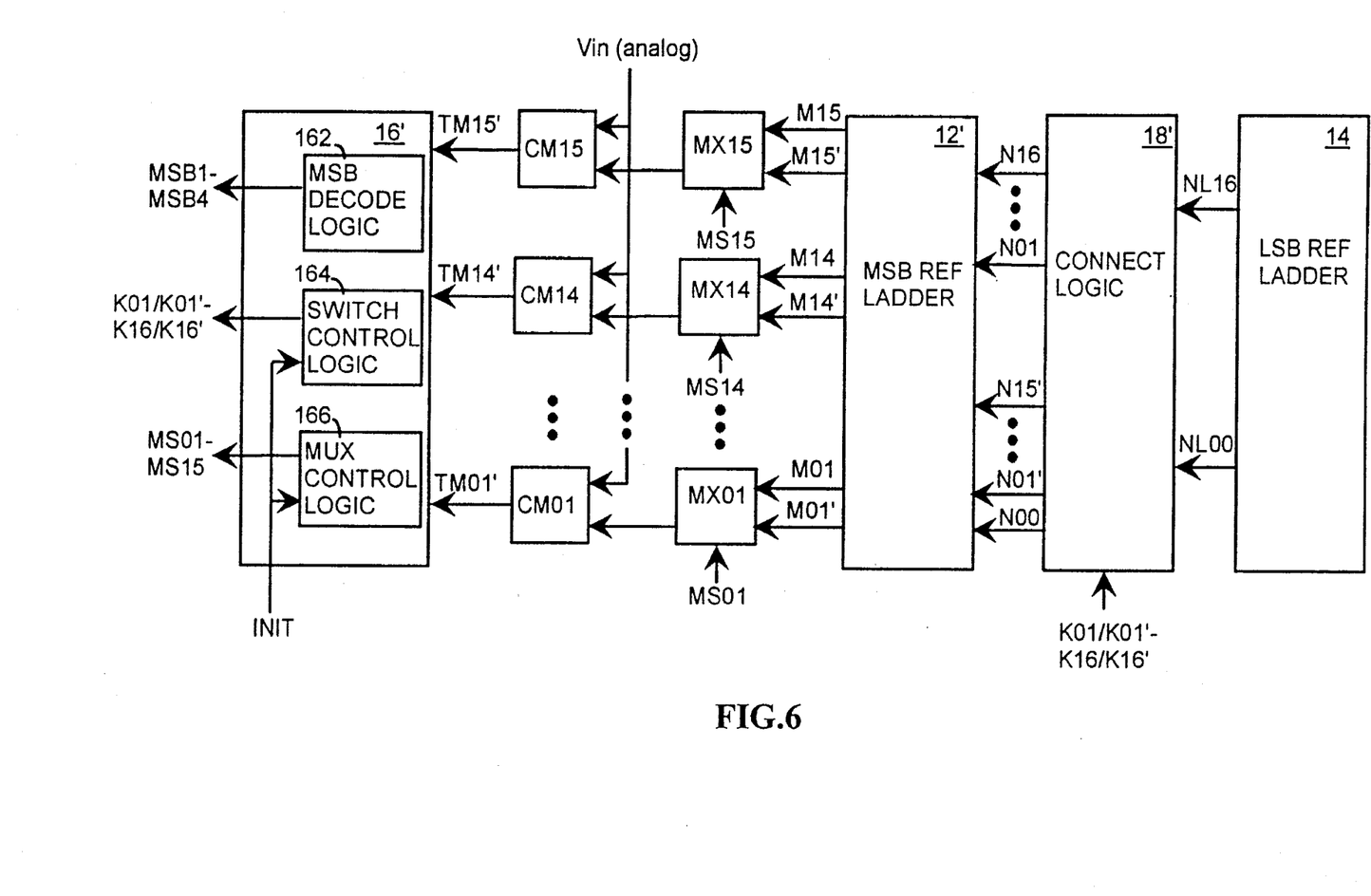
FIG. 6 illustrates, as an example, a portion of a two-step flash ADC including the circuit of FIG. 4 and utilizing aspects of the present invention.
Figure 7:
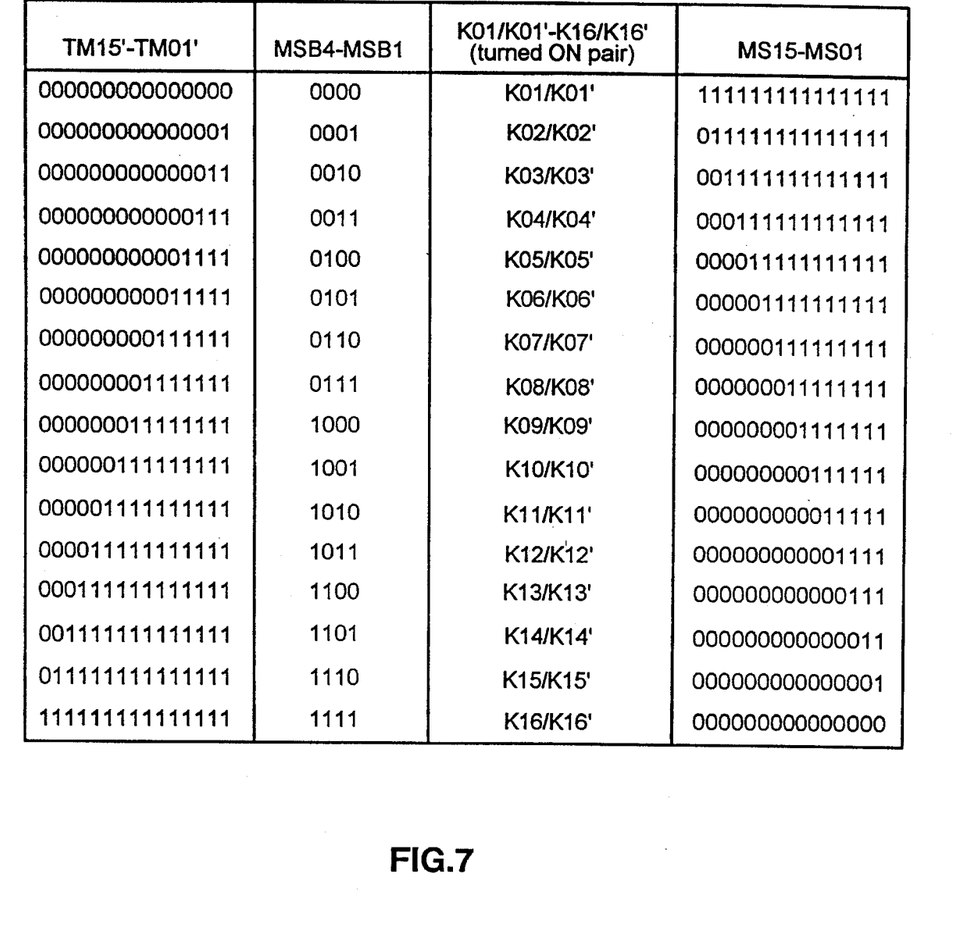
FIG. 7 illustrates, as an example, a table providing the four most-significant-bits MSB4-MSB1, the control input pair K01/K01'-K16/K16' turned ON, and the multiplexer select control signals MS15-MS01 corresponding to each possible combination of MSB comparator outputs TM01'-TM15' for the two-step flash ADC of FIG. 6.
Figure 8:
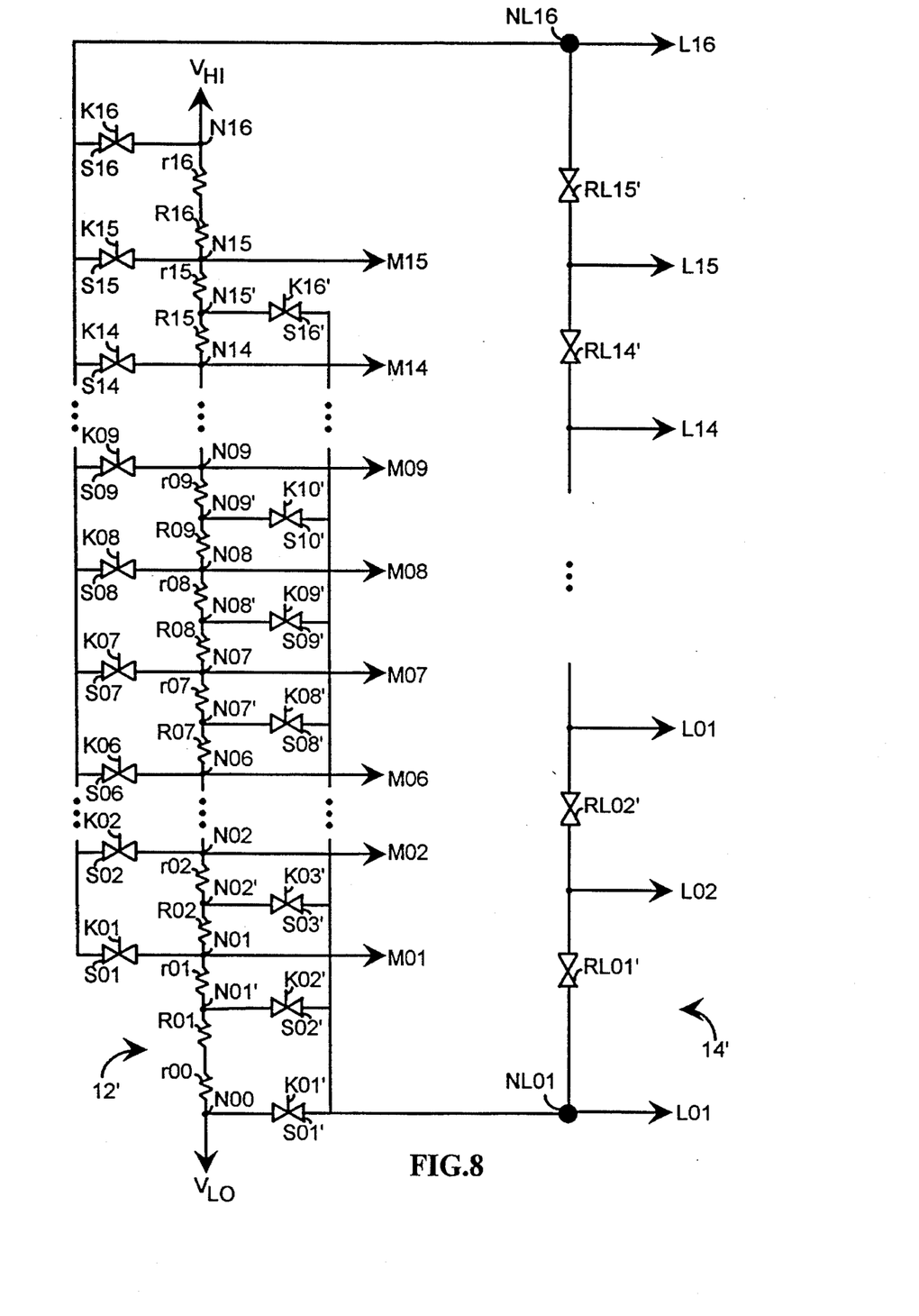
FIG. 8 illustrates, as an example of a second preferred embodiment of the invention, a circuit diagram utilizing aspects of the present invention, which includes a MSB reference ladder, LSB reference ladder, and connection logic circuit.
Figure 9:
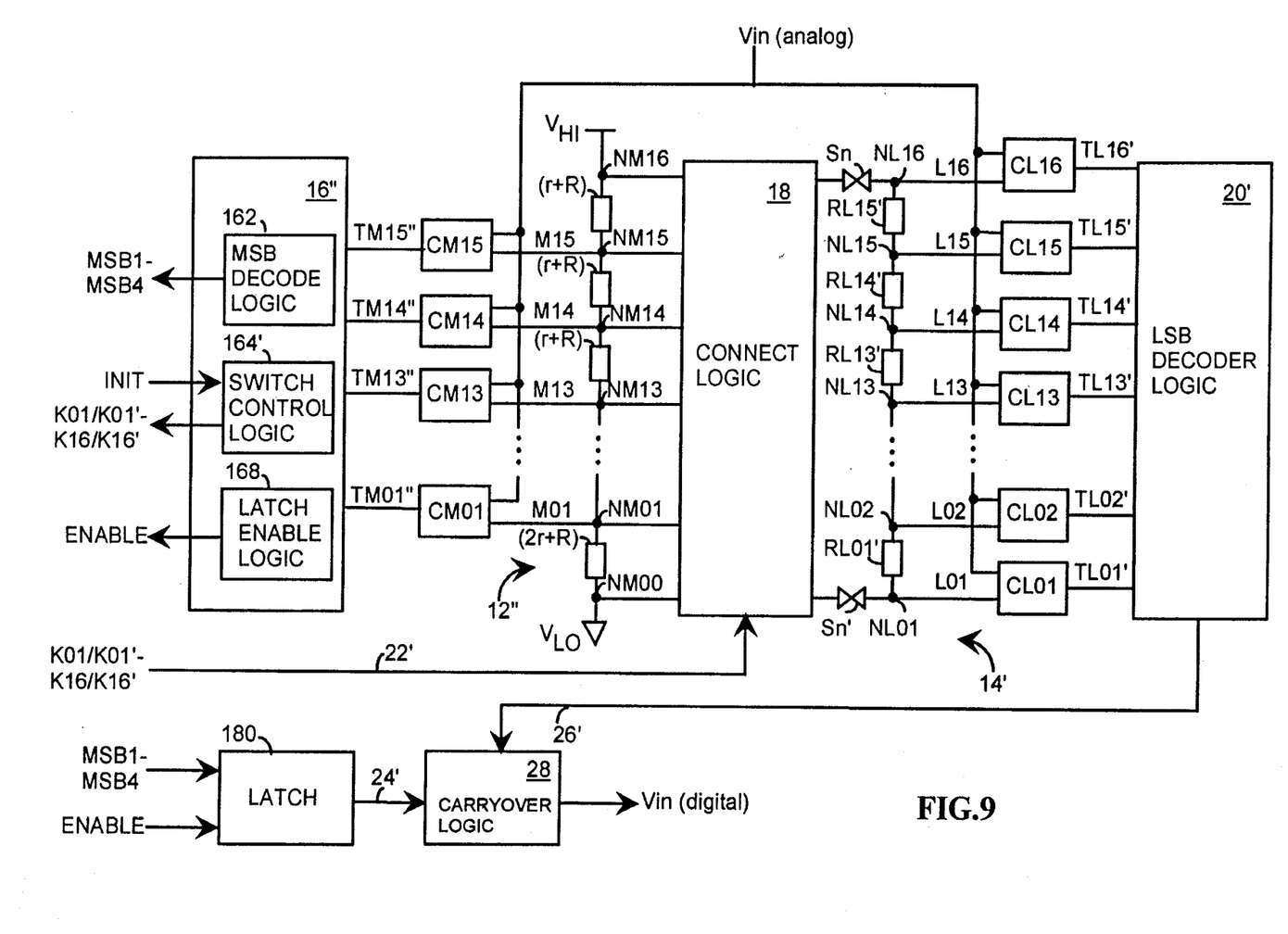
FIG. 9 illustrates, as an example, a portion of a two-step flash ADC including the circuit of FIG. 8 and utilizing aspects of the present invention.

FIGS. 4-7 are illustrative of a first preferred embodiment of the present invention, and FIGS. 8-9 are illustrative of a second preferred embodiment of the present invention, wherein the first preferred embodiment is especially suited for applications requiring maximum speed and the second preferred embodiment is especially suited for applications requiring minimal complexity. Although the figures illustrate 8-bit two-step flash ADCs, it is to be appreciated that the present invention is not limited to a two-step flash ADC of a particular resolution. Where identical reference numbers are used in the figures, identical components are contemplated, except where the reference number is primed (i.e., followed by an apostrophy or quotation mark), in which case, an improved version of the component or signal is contemplated.

Figure 4:
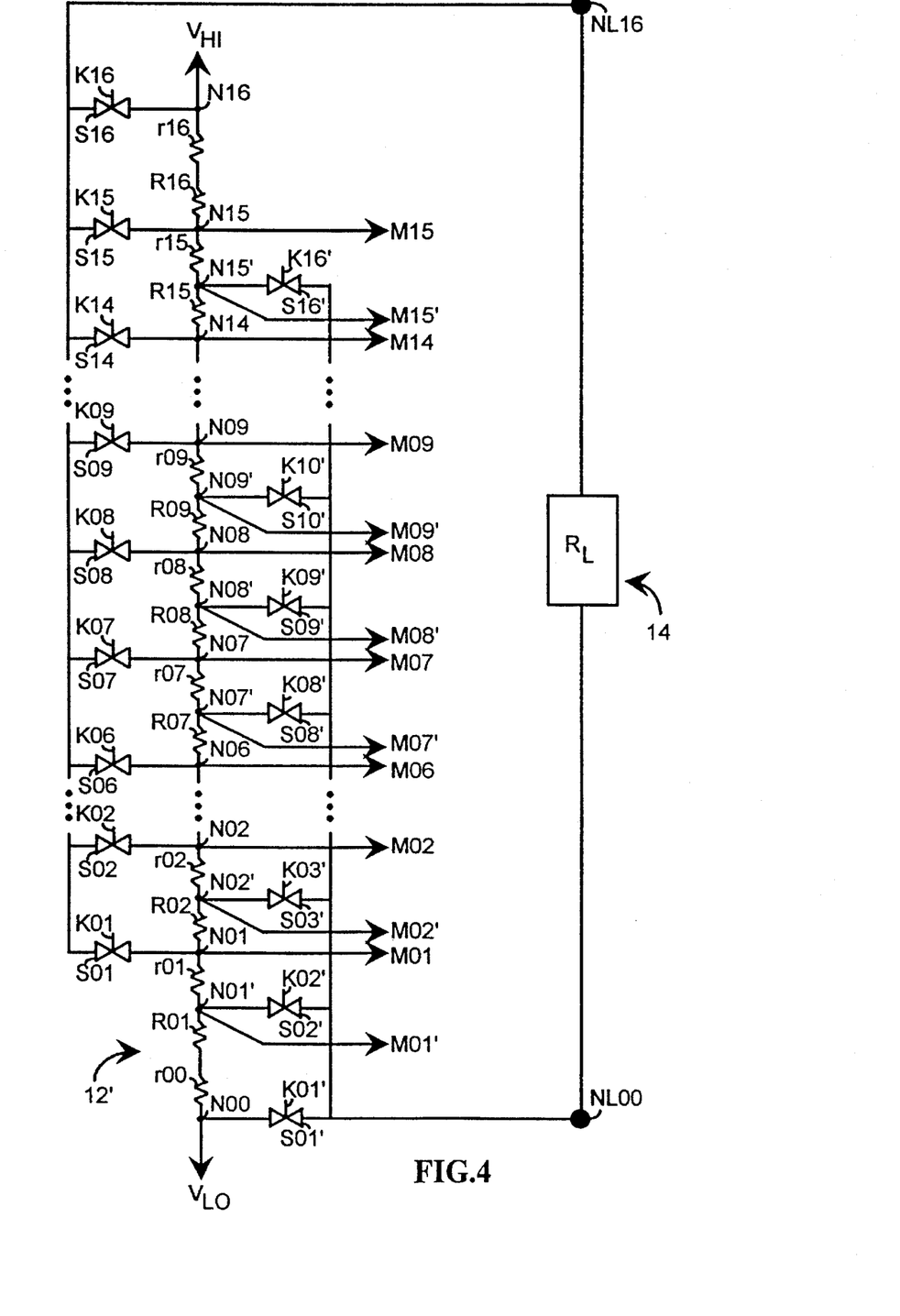
FIG. 4 illustrates, as an example of a first preferred embodiment of the invention, a circuit diagram utilizing aspects of the present invention, which includes a MSB reference ladder, LSB reference ladder, and connection logic circuit.

FIG. 4 illustrates, as an example, a circuit diagram utilizing aspects of the present invention, which includes a MSB reference ladder 12', a LSB reference ladder 14, and a connection logic circuit 18' comprising passgates S01-S16 and S01'-S16'. In this example, the LSB reference ladder 14 is identical in construction to the prior art LSB reference ladder as depicted in FIG. 2. Accordingly, the LSB reference ladder 14 comprises a plurality of equal-valued resistors RL01-RL16 serially connected together to form a total resistance of $R_L$. The MSB reference ladder 12', on the other hand, is an improved version of the prior art MSB reference ladder 12 as depicted in FIG. 2.

The MSB reference ladder 12' is constructed by serially connecting together between a low reference voltage $V_{LO}$ and a high reference voltage $V_{HI}$, a first plurality of equal-valued resistors r00-r16, each having a resistance r, and a second plurality of equal-valued resistors R01-R16, each having a resistance R, preferably on an alternating basis (i.e., r(k+1) following R(k+1) following r(k)) starting with r00 connected to the low reference voltage $V_{LO}$ and ending with r16 connected to the high reference voltage $V_{HI}$. The number of the first plurality of resistors r00-r16 is one greater than the number of the second plurality of resistors R01-R06, and the resistances r, R and $R_L$ are such that the following equation is satisfied:

$$\frac{R_L * (2r + R)}{R_L + (2r + R)} = r + R \quad (3)$$

As an example, if the value R of each of the second plurality of resistors RM01-RM16 is equal to 200Ω and the total resistance $R_L$ of the LSB reference ladder 14 is equal to 3,200Ω, then a value r for each of the first plurality of resistors r00-r16 approximately equal to 15.4Ω would satisfy the above equation. In practice, the respective values of the resistors r, R, and $R_L$ may be selected such that none of the resistors is so large that the others are insignificant in comparison. An example of such an undesirable condition would be if r<<R, in which case the MSB reference ladder 12' of FIG. 4 would effectively be identical with the prior art MSB reference ladder 12 of FIG. 2.

The connection logic circuit 18' comprises passgates S01-S16 and S01'-S16', wherein passgate pairs are formed by pairing unprimed and primed passgates having the same numbers (e.g., S01 and S01'). The connection logic circuit 18' connects the LSB reference ladder 14 across a selected (2r+R) leg of the MSB reference ladder 12' by turning ON both passgates of a corresponding one of the passgate pairs S01/S01'-S16/S16', while turning OFF all other passgates through their respective control inputs K01-K16 and K01'-K16'. Each (2r+R) leg of the MSB reference ladder 12' which the connection logic circuit 18' connects the LSB reference ladder 14 across, includes two successive ones of the first plurality of resistors r00-r16 and one of the second plurality of resistors R01-R06 connected between the two successive ones of the first plurality of resistors r00-r16. For example, to connect the LSB reference ladder 14 across a first (2r+R) leg comprising resistors r00, R01, and r01 of the MSB reference ladder 12', a HIGH signal is applied to both control inputs K01 and K01' which turns ON their respective passgates S01 and S01', and a LOW signal is applied to all other control inputs K02-K16 and K02'-K16' which turns OFF their respective passgates S02-S16 and S02'-S16'.

Figure 5A:
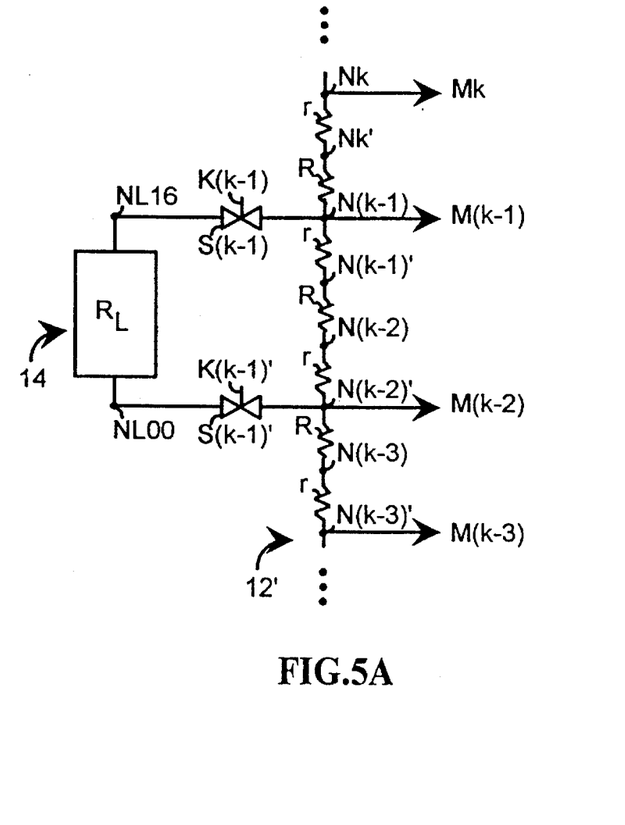
FIGS. 5A and 5B respectively illustrate a LSB reference ladder connected across two adjacent nodes of a MSB reference ladder utilizing aspects of the present invention, and a corresponding effective MSB reference ladder with the reference ladder so connected.
Figure 5B:
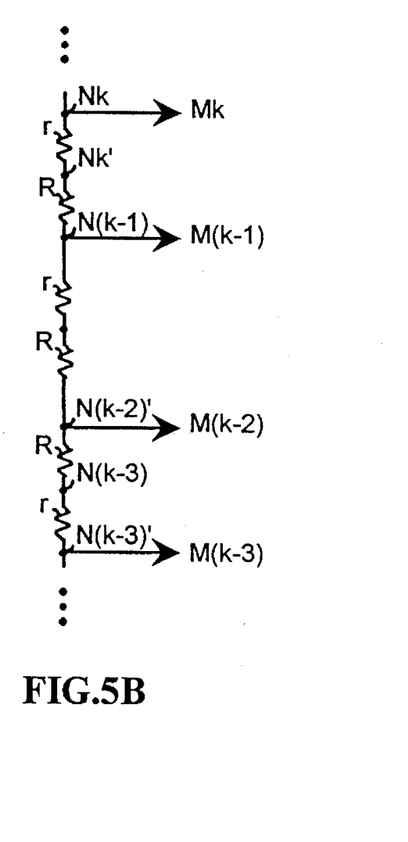

The connection logic circuit 18' always connects the LSB reference ladder 14 to a (2r+R) leg of the MSB reference ladder 12', even during a first step of the two-step flash ADC. During the first step of the two-step flash ADC, the connection logic circuit 18' preferably connects the LSB reference ladder 14 across the middle of the MSB reference ladder 12' across the (2r+R) leg comprising resistors r07, R08, and r08 at nodes N08 and N07'. During the second step of the two-step flash ADC, the connection logic circuit 18' connects the LSB reference ladder 14 across a selected (2r+R) leg determined by the input voltage Vin. Because the LSB reference ladder 14 had been initially connected across the middle of the MSB reference ladder 12', connection to (2r+R) legs above or below the the initial connection point is faster than if the LSB reference ladder 14 had been initially connected across the bottom of the MSB reference ladder 12' since the LSB reference voltages would not have to charge up as much. With the values of the resistances r, R, and $R_L$ selected so as to satisfy equation (3), by connecting the LSB reference ladder 14 across a (2r+R) leg of the MSB reference ladder 12', such as between nodes N(k-1) and N(k-2)' in FIG. 5A, the effective resistance of that leg becomes r+R, as shown in FIG. 5B. Consequently, the total effective resistance of the MSB reference ladder 12'depicted in FIG. 4 is equal to 16*(r+R) with the LSB reference ladder 14 connected to it during both the first and second steps of the two-step flash ADC.

Since the effective resistance of the MSB reference ladder 12' is equal to 16*(r+R) during both the first and second steps of the two-step flash ADC, fifteen voltages, each separated by an actual or effective (r+R) leg of the MSB reference ladder 12' can be picked off the MSB reference ladder 12' to act as MSB reference voltages, wherein the differential voltage between adjacent MSB reference voltages is:

$$\Delta V' = I'^*(r+R) \quad (4)$$

where I' is equal to the current flowing through the MSB reference ladder 12' during both the first and second steps of the two-step flash ADC, r is the value of each of the first plurality of resistors r00–r16 of the MSB reference ladder 12', and R is the value of each of the second plurality of resistors R01–R06 of the MSB reference ladder 12'.

Accordingly, the MSB reference ladder 12' can provide fifteen MSB reference voltages whose values are the same regardless of whether the two-step flash ADC is performing its first or second step, and regardless of where the LSB reference ladder 14 is connected across the MSB reference ladder 12', thus solving the measurement accuracy problem described in reference to FIGS. 1–3 of the prior art. One problem with providing such MSB reference voltages, however, is that their pick-off points (i.e., nodes) change along the MSB reference ladder 12' as the connection points of the LSB reference ladder 14 to the MSB reference ladder 12' changes. For example, if the LSB reference ladder 14 is connected to the MSB reference ladder 12' across nodes N00 and N01, the fifteen reference voltages should be respectively picked-off at nodes N01–N15. On the other hand, if the LSB reference ladder 14 is connected to the MSB reference ladder 12' across nodes N08 and N07', the fifteen reference voltages should instead, be respectively picked-off at nodes N01'–N07' and N08–N15. From these and similar examples, a pattern becomes apparent that if the LSB reference ladder 14 is connected to the MSB reference ladder 12' across nodes N(k–1) and N(k–2)', then the fifteen reference voltages should be respectively picked-off at all primed nodes below and including N(k–2)' and all unprimed nodes above and including N(k–1), except in the case where the LSB reference ladder 14 is connected across nodes N00 and N01 as described above.

FIG. 6 illustrates parts of an 8-bit two-step flash ADC including the circuit of FIG. 4, and utilizing aspects of the present invention. Included in the 8-bit two-step flash ADC is a MSB reference ladder 12' and connection logic circuit 18' as previously described in reference to FIG. 4, a plurality of multiplexers MX01–MX15, a plurality of MSB comparators CM01–CM15, and a logic circuit 16' including a MSB decode logic circuit 162, a switch control logic circuit 164, and a multiplexer control logic circuit 166. Other parts of the 8-bit two-step flash ADC which are not shown in the figure include a plurality of LSB comparators CL01–CL16, a LSB decoder logic circuit 20, and a carryover logic 28, which may be constructed and operated in the same fashion as their prior art counterparts as described in reference to FIG. 1.

Each multiplexer of the plurality of multiplexers MX01–MX15 receives a corresponding pair of like-numbered primed and unprimed reference voltages picked-off the MSB reference ladder 12', and passes either the primed or unprimed reference voltage to its corresponding one of the MSB comparators CM01–CM15, depending upon the logic level on its corresponding one of the select signals MS01–MS15. For example, multiplexer MX01 receives reference voltages M01' and M01 from the MSB reference ladder 12' and passes the reference voltage M01' to one input of the comparator CM01 if it receives, for example, a logic level LOW on select signal MS01, and passes the reference voltage M01 to that input of the comparator CM01 if it receives, for example, a logic level HIGH on select signal MS01.

Each of the MSB comparators CM01–CM15, in turn, receives at one input the passed through reference voltage from its corresponding one of the multiplexers MX01–MX15, receives at another input the analog input voltage Vin, and compares the two to generate an output in a similar manner as the MSB comparators CM01–CM15 described in reference to FIG. 1. In particular, the respective outputs TM01'–TM15' of the MSB comparators CM01–CM15 resemble a so-called "thermometer" output in that each output corresponding to a passed through reference voltage less than the input voltage Vin is HIGH, and each output corresponding to a passed through reference voltage greater than or equal to the input voltage Vin is LOW. FIG. 7 illustrates in a first column under TM15'–TM01' (LSB to MSB going from right to left), all sixteen possible combinations of the outputs TM01'–TM15'.

The MSB decode logic circuit 162, the switch control logic circuit 164, and the multiplexer control logic circuit 166 each receive the outputs TM01'–TM15' of the MSB comparators CM01–CM15, and generate their respective outputs MSB1-MSB4, K01/K01'–K16/K16', and MS01–MS15 in response thereof. FIG. 7 illustrates in a second column under MSB4-MSB1 (LSB to MSB going from right to left), the corresponding four most-significant-bits 24 generated by the MSB decode logic circuit 162 for each of the sixteen possible combinations of the outputs TM01'–TM15'; in a third column under K01/K01'–K16/K16', the activated control input pair of the control inputs K01–K16 and K01'–K16' generated by the switch control logic circuit 164 for each of the sixteen possible combinations of the outputs TM01'–TM15'; and in a fourth column under MS15–MS01 (LSB to MSB going from right to left), the corresponding select signals MS01–MS15 generated by the multiplexer control logic circuit 166 for each of the sixteen possible combinations of the outputs TM01'–TM15'. Means of implementing such simple mapping functions are well known and accordingly, the logic circuit implementations for the MSB decode logic circuit 162, the switch control logic circuit 164, and the multiplexer control logic circuit 166 are not shown. For speed considerations, however, hardwired logic would be preferable in implementing these functions rather than table look-up techniques.

The operation of the 8-bit two-step flash ADC described in reference to FIGS. 6 and 7 is now further clarified by way of illustrative example, wherein $V_{HI}$=16 volts, $V_{LO}$=0 volts, and Vin=12.3 volts. In a first step of the two-step flash ADC, an initialization signal INIT received by both the switch control logic circuit 164 and the multiplexer control logic circuit 166, is made active, for example, by an enable signal to the two-step flash ADC. Activation of the initialization signal INIT causes both the switch control logic circuit 164 and the multiplexer control logic circuit 166 to generate a set of outputs corresponding to a predetermined location of the MSB reference ladder 12' across which the LSB reference ladder 14 is to be initially connected. Since the initial location in this example is the middle of the MSB reference ladder 12', the passgate pair S08/S08' is to be turned ON while all other passgate pairs S01/S01'–S07/S07' and S09/S09'–S16/S16' are turned OFF. Accordingly, referring to FIG. 7, for example, this condition corresponds to activating the control signal pair K08/K08' while deactivating control signal pairs K01/K01'–K07/K07' and K09/K09'–K16/K16', and generating LOW logic levels on select signals MS01–MS07 while generating HIGH logic levels on select signals MS08–MS15. With the control signal pairs K01/

K01'–K16/K16' and the select signals MS08–MS15 so generated, the LSB reference ladder 14 is initially connected across nodes N08 and N07' of the MSB reference ladder 12', and multiplexers MX01–MX07 respectively pass their received primed reference voltages M01'–M07' to their corresponding MSB comparators CM01–CM07 while multiplexers MX08–MX15 respectively pass their received unprimed reference voltages M08–M15 to their corresponding MSB comparators CM08–CM15.

As described in reference to FIG. 4, the reference voltages thus passed by the multiplexers M01–M15 are each picked-off at locations on the MSB reference ladder 12' which are separated by an actual or effective resistance of (r+R). In particular, since the total effective resistance of the MSB reference ladder 12' is equal to 16*(r+R) and the voltage across the MSB reference ladder 12' is equal to 16 volts, then the differential voltage between adjacent ones of the MSB reference voltages thus picked-off can be shown to be 1.0 volts and in particular, the MSB reference voltages can be shown to be: M01'=1.0 volts, M02'=2.0 volts, M03'=3.0 volts, M04'=4.0 volts, M05'=5.0 volts, M06'=6.0 volts, M07'=7.0 volts, M08=8.0 volts, M09=9.0 volts, M10=10.0 volts, M11=11.0 volts, M12=12.0 volts, M13=13.0 volts, M14=14.0 volts, and M15=15.0 volts.

Since Vin=12.3 volts, the outputs TM01'–TM15' of the MSB comparators CM01–CM15 would respectively be HIGH, HIGH, HIGH, HIGH, HIGH, HIGH, HIGH, HIGH, HIGH, HIGH, HIGH, HIGH, LOW, LOW, and LOW (i.e., 000111111111111 in FIG. 7). Referring to FIG. 7, the four most-significant-bits MSB4-MSB1 generated by the MSB decode logic circuit 162 would be HIGH, HIGH, LOW, and LOW (i.e., 1100), and the switch control logic circuit 164 would turn ON passgate pair S13/S13' by activating control signal pair K13/K13' while turning OFF all other passgate pairs by deactivating their respective control signals. As a result, the LSB reference ladder 14 is connected across nodes N13 and N12' in preparation for the second step of the two-step flash ADC. The second step of the two-step flash ADC then proceeds as described in reference to FIG. 1 with the LSB reference ladder now connected across nodes N13 and N12'.

FIG. 8 illustrates, as an especially preferred embodiment of the invention, a circuit diagram utilizing aspects of the present invention, which includes a MSB reference ladder 12", a LSB reference ladder 14', and a connection logic circuit 18' comprising passgates S01–S16 and S01'–S16'. In this example, both the MSB and LSB reference ladders, 12" and 14', respectively, are improved versions of the prior art MSB and LSB reference ladders, 12 and 14, respectively, depicted in FIG. 2.

The MSB reference ladder 12" is identically constructed as the MSB reference ladder 12' of FIG. 4, except that the pick-off connections at nodes N01'–N15' for the primed MSB reference voltages M01'–M15' of FIG. 4 are eliminated. The operation of a two-step flash ADC including MSB reference ladder 12" of FIG. 8, is described in reference to FIG. 9. In the first step of the two-step flash ADC, the LSB reference ladder 14' is initially connected across nodes N00 and N01 by switch control logic circuit 164' in the same manner as described in reference to the operation of switch control logic circuit 164 in FIG. 6. With the LSB reference ladder 14' thus connected to the bottom (2r+R) leg of the MSB reference ladder 12", MSB reference voltages M01–M15 are picked-off at nodes N01–N15 and provided to their respective comparators CM01–CM15 along with the analog input voltage Vin to generate comparator outputs TM01"–TM15" in a similar manner as described in reference to FIG. 6. A MSB decode logic circuit 162 and the switch control logic circuit 164' receive the comparator outputs TM01"–TM15" and respectively generate the four most-significant-bits MSB4-MSB1 and the switch control signals K01–K16 and K01'–K16' in a similar manner as described in reference to FIGS. 6 and 7. The four most-significant-bits MSB4-MSB1 are then latched into latch 180 in response to an enable signal being active, for example, logic level HIGH, and the switch control signals K01–K16 and K01'–K16' are provided to the switch connect logic circuit 18 via control lines 22'. The enable signal is provided by latch enable logic circuit 168. In one example of the latch enable logic circuit 168, the latch enable logic circuit 168 comprises a decoder circuit which receives the switch control signals K01 and/or K01' from the switch control logic circuit 164', and generates an enable signal of the same logic state, for example, as the switch control signals K01 and/or K01' so that the enable signal is only active when the LSB reference ladder 14' is connected across nodes N00 and N01 of the MSB reference ladder 12".

In the second step of the two-step flash ADC, the LSB reference ladder 14' is then connected across the appropriate nodes of the MSB reference ladder 12" as determined by the input voltage Vin. With the LSB reference ladder 14' so connected to the MSB reference ladder 12", the MSB reference voltages M01–M15 may be disturbed causing the comparator outputs TM01"–TM15" and consequently, the four most-significant-bits MSB4-MSB1 to change from their values as generated in the first step of the two-step flash ADC. To prevent such changed values for the four most-significant-bits MSB4-MSB1 to pass through to carryover logic circuit 28, the latch enable logic circuit 168 generates an inactive latch enable signal, for example, logic level LOW. Consequently, the four most-significant-bits MSB4-MSB1 are not latched into the latch 180 during the second step of the two-step flash ADC.

The LSB reference ladder 14' comprises fifteen equal-valued resistors RL01'–RL15' instead of the sixteen as depicted in the prior art of FIG. 2. In this embodiment, the sixteenth resistor is effectively provided by the passgate pair (e.g., Sn/Sn') connecting the LSB reference ladder 14' to the MSB reference ladder 12". For example, if the resistance value of each of the resistors RL01'–RL15' is equal to $R_{LSB}$, then the resistance value of each of the passgates S01–S16 and S01'–S16' is equal to ½*$R_{LSB}$ when the passgate is turned ON.

Although the total resistance of the LSB reference ladder 14' as depicted in FIG. 8, is the same as that of the prior art LSB reference ladder 14 as depicted in FIG. 2, i.e., equal to 16*$R_{LSB}$, the pick-off points for the LSB reference voltages L01–L16 in FIG. 8 are different than those of the prior art LSB reference voltages VL01–VL16 in FIG. 2 and consequently, their corresponding values are different. In particular, the LSB reference voltages L01–L16 in FIG. 8 are off-set by one-half a least-significant-bit from their corresponding prior art LSB reference voltages VL01–VL16 in FIG. 2. For example, if $V_{LO}$=GND=0 volts and the LSB reference ladder 14' is connected across nodes N00 and N01 of the MSB reference ladder 12" in FIG. 8, then L01=$I_L$'*(½*$R_{LSB}$'). On the other hand, if the LSB reference ladder 14 is connected across nodes NM00 and NM01 of the MSB reference ladder 12 in FIG. 2, then VL01=$I_L$*$R_{LSB}$. Assuming the current $I_L$' flowing through the LSB reference ladder 14' is equal to the current $I_L$ flowing through the prior art LSB reference ladder 14, and the resistance $R_{LSB}$' of each of the passgates RL01'–RL16' is equal to the resistance $R_{LSB}$ of each of the passgates RL01–RL16, then L01=½*VL01. Each subsequent LSB reference voltage (e.g., Ln) picked-off the LSB reference ladder 14' is then incrementally larger than a previous LSB reference voltage (e.g., L(n–1)) by $\Delta V'= I_L'*R_{LSB}'$, and each subsequent LSB reference voltage (e.g., VLn) picked-off the prior art LSB reference ladder 14 is then incrementally larger than a previous LSB reference voltage (e.g., VL(n–1)) by $\Delta V=I_L*R_{LSB}$ (i.e., a least-significant-bit).

The digital version of the analog input Vin is then generated in the same manner as described in reference to FIG. 6 by carryover logic circuit 28 which receives the four most-significant-bits 24' from the latch 180 and the four least-significant-bits 26' from LSB decoder logic circuit 20' and combines them accordingly.

Although the various aspects of the present invention have been described with respect to a preferred embodiment, it will be understood that the invention is entitled to full protection within the full scope of the appended claims.

What is claimed is:

1. In a flash analog-to-digital converter having a plurality of MSB comparators for comparing an input voltage against a plurality of MSB reference voltages useful for generating the most-significant-bits of a binary number indicative of said input voltage and a plurality of LSB comparators for comparing said input voltage against a plurality of LSB reference voltages useful for generating the least-significant-bits of said binary number indicative of said input voltage, a circuit for generating said pluralities of MSB and LSB reference voltages comprising:

a LSB resistor network having a total resistance $R_L$;

a MSB resistor network connected between high and low reference voltages, said MSB resistor network including a first plurality of resistors each having a resistance r and a second plurality of resistors each having a resistance R, wherein the number of said first plurality of resistors is one greater than the number of said second plurality of resistors, and said resistances r, R and $R_L$ are such that an effective resistance of said LSB resistor network in parallel with a first series connection consisting of two of said first plurality of resistors and one of said second plurality of resistors is substantially equal to a second series connection consisting of one of said first plurality of resistors and one of said second plurality of resistors; and means for connecting said LSB resistor network in parallel with a selected portion of said MSB resistor network, wherein said selected portion of said MSB resistor network has a resistance substantially equal to said first series connection consisting of two of said first plurality of resistors and one of said second plurality of resistors, and generating said plurality of MSB reference voltages from selected nodes of said MSB resistor network, and generating said plurality of LSB reference voltages from selected nodes of said LSB resistor network.

2. The circuit as recited in claim 1, wherein said first and second plurality of resistors of said MSB resistor network are serially connected together on an alternating basis such that each of said second plurality of resistors is connected between adjacent ones of said first plurality of resistors, said high reference voltage is connected to a first one of said first plurality of resistors, and said low reference voltage is connected to a last one of said first plurality of resistors.

3. The circuit as recited in claim 2, wherein said connected together MSB and LSB resistor networks form a voltage divider circuit between said high reference voltage and said low reference voltage, said voltage divider circuit including a plurality of resistance legs, each of said plurality of resistance legs having a resistance substantially equal to said second series connection consisting of one of said first plurality of resistors and one of said second plurality of resistors, and attached to at least one of said selected nodes from which said plurality of MSB reference voltages are generated.

4. The circuit as recited in claim 2, wherein each of said first plurality of resistors of said MSB resistor network has a high voltage end and a low voltage end, and said means for connecting said LSB resistor network in parallel with said selected portion of said MSB resistor network comprises:

a first plurality of switches, each of said first plurality of switches connecting a first end of said LSB resistor network to the high voltage end of one of said first plurality of resistors of said MSB resistor network, wherein each of said first plurality of resistors is connected to one of said first plurality of switches except the last one of said first plurality of resistors;

a second plurality of switches, each of said second plurality of switches connecting a second end of said LSB resistor network to the low voltage end of one of said first plurality of resistors of said MSB resistor network, wherein each of said first plurality of resistors is connected to one of said second plurality of switches except the first one of said first plurality of resistors; and logic means for selectively turning on, in response to said input voltage, only one of said first plurality of switches and a corresponding one of said second plurality of switches, wherein included along said MSB resistor network between connections to corresponding ones of said first and second plurality of switches are two of said first plurality of resistors and one of said second plurality of resistors.

5. The circuit as recited in claim 4, wherein said plurality of MSB reference voltages are generated at the high voltage ends of said first plurality of resistors of said MSB resistor network connected between said voltage reference and the connection to said MSB resistor network of the selectively turned on one of said first plurality of switches, including said connection to said MSB resistor network of the selectively turned on one of said first plurality of switches, and the low voltage ends of said first plurality of resistors of said MSB resistor network connected between said ground and the connection to said MSB resistor network of the selectively turned on one of said second plurality of switches, including said connection to said MSB resistor network of the selectively turned on one of said second plurality of switches.

6. The circuit as recited in claim 4, wherein said plurality of MSB reference voltages are generated at the high voltage ends of a first half of said first plurality of resistors of said MSB resistor network connected closest to said high reference voltage, and at the low voltage ends of a second half of said first plurality of resistors of said MSB resistor network connected closest to said low reference voltage.

7. A two-step flash analog-to-digital converter comprising:

a MSB reference ladder connected across high and low reference voltages to provide a plurality of MSB reference voltages to be compared against an analog input voltage; and a LSB reference ladder connected by first and second switching means across a selected portion of said MSB reference ladder determined by the comparison of said MSB reference voltages against said analog input voltage to provide a plurality of LSB reference voltages to be compared against said analog input voltage, said LSB reference ladder having a plurality of equal valued resistors of resistance of $R_{LSB}$, and said first and second switching means each having a resistance of $(½)*R_{LSB}$, wherein a first one of said plurality of LSB reference voltages is provided at a first node connecting said first switching means to a first one of said plurality of equal valued resistors of said LSB reference ladder, and a last one of said plurality of LSB reference voltages is provided at a last node connecting said second switching means to a last one of said plurality of equal valued resistors of said LSB reference ladder.

8. The two-step flash analog-to-digital converter as recited in claim 7, wherein said MSB reference ladder comprises a first plurality of resistors each having a resistance r and a second plurality of resistors each having a resistance R, wherein the number of said first plurality of resistors is one greater than the number of said second plurality of resistors, and said LSB reference ladder has a total resistance $R_L$, wherein the resistances $R_L$, r, and R substantially satisfy the following relationship:

$$\frac{R_L(R+2r)}{R_L+(R+2r)} = R+r.$$

9. The two-step flash analog-to-digital converter as recited in claim 8, further comprising means for connecting said LSB reference ladder in parallel with said selected portion of said MSB reference ladder, wherein said selected portion of said MSB reference ladder has a resistance of (R+2r).

10. A method of generating a plurality of reference voltages for determining the most-significant-bits in a two-step flash analog-to-digital converter, comprising the steps of:

forming a most-significant-bits reference ladder by serially connecting together a first and second plurality of resistors between high and low reference voltages, such that said first and second plurality of resistors are connected in an alternating fashion starting with a first one of said first plurality of resistors connected to said low reference voltage and a last one of said first plurality of resistors connected to said high reference voltage, wherein each of said first plurality of reference voltages has a resistance equal to r, each of said second plurality of resistors has a resistance equal to R, and a least-significant-bits reference ladder switchably connectable to selected legs of the most-significant-bits reference has a total resistance of $R_L$, and the resistances r, R and $R_L$ are such that an effective resistance of said least-significant-bits reference ladder connected in parallel to a (2r+R) leg of said most-significant-bits reference ladder consisting of two of said first plurality of resistors and one of said second plurality of resistors is substantially equal to a (r+R) leg of said most-significant-bits reference ladder consisting of one of said first plurality of resistors and one of said second plurality of resistors;

during a first step of said two-step flash analog-to-digital converter, switchably connecting said least-significant-bits reference ladder across a preselected (2r+R) leg of said most-significant-bits reference ladder; and generating said plurality of reference voltages from signals picked-off a plurality of nodes defined on said most-significant-bits reference ladder, wherein the effective resistance between adjacent ones of said plurality of nodes is substantially equal to a (r+R) leg of said most-significant-bits reference ladder.

* * * * *